(12) United States Patent
Wu et al.

(10) Patent No.: US 10,038,259 B2
(45) Date of Patent: Jul. 31, 2018

(54) LOW INSERTION LOSS PACKAGE PIN STRUCTURE AND METHOD

(71) Applicant: Xilinx, Inc., San Jose, CA (US)

(72) Inventors: Paul Y. Wu, Saratoga, CA (US); Sarajuddin Niazi, Union City, CA (US); Raymond E. Anderson, Santa Cruz, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 907 days.

(21) Appl. No.: 14/174,697

(22) Filed: Feb. 6, 2014

(65) Prior Publication Data

US 2015/0222033 A1 Aug. 6, 2015

(51) Int. Cl.
| | |
|---|---|
| *H05K 1/11* | (2006.01) |
| *H05K 1/14* | (2006.01) |
| *H01R 12/71* | (2011.01) |
| *H01R 43/02* | (2006.01) |
| *H01L 23/538* | (2006.01) |
| *H01L 23/498* | (2006.01) |

(52) U.S. Cl.
CPC ......... *H01R 12/71* (2013.01); *H01L 23/5385* (2013.01); *H01R 43/0235* (2013.01); *H01L 23/49816* (2013.01); *H01L 23/5386* (2013.01); *H01L 2224/16* (2013.01); *H01L 2924/0002* (2013.01); *Y10T 29/49117* (2015.01)

(58) Field of Classification Search
CPC ............... H01L 24/49; H01L 23/4981; H01L 23/49833; H01L 23/49805; H05K 1/147–1/148

USPC ............... 361/770–774, 790, 792–795, 803; 257/666–690, 723–730
See application file for complete search history.

(56) References Cited

U.S. PATENT DOCUMENTS

| | | | | |
|---|---|---|---|---|
| 6,586,684 | B2 * | 7/2003 | Frutschy | H01L 23/49811 174/260 |
| 6,797,891 | B1 * | 9/2004 | Blair | H05K 1/147 174/110 R |
| 6,979,891 | B2 * | 12/2005 | Wood | H01L 23/49805 257/679 |
| 7,247,517 | B2 * | 7/2007 | Rumer | H01L 23/055 257/E21.507 |
| 7,345,359 | B2 * | 3/2008 | Kim | H01L 23/49833 257/678 |
| 7,867,821 | B1 * | 1/2011 | Chin | H01L 23/3128 257/E21.499 |
| 7,923,290 | B2 * | 4/2011 | Ko | H01L 23/481 257/E21.499 |

(Continued)

FOREIGN PATENT DOCUMENTS

| | | |
|---|---|---|
| WO | 2005091366 | 9/2005 |
| WO | 2013095544 | 6/2013 |

*Primary Examiner* — Tuan T Dinh
(74) *Attorney, Agent, or Firm* — Gerald Chan; Steven Roberts

(57) ABSTRACT

An apparatus for placement between a package and an integrated circuit board includes: an insert having: a substrate having a top side and a bottom side; a first set of pads at the top side of the substrate; a second set of pads at the bottom side of the substrate; and a plurality of vias in the substrate, the vias connecting respective pads in the first set to respective pads in the second set; wherein the insert has a thickness that is less than a spacing between the package and the integrated circuit board.

14 Claims, 13 Drawing Sheets

(56) References Cited

U.S. PATENT DOCUMENTS

| | | | |
|---|---|---|---|
| 8,519,537 B2* | 8/2013 | Jeng | ........................ H01L 23/13 |
| | | | 257/668 |
| 9,059,179 B2* | 6/2015 | Karikalan | ................ H01L 24/49 |
| 2005/0167798 A1 | 8/2005 | Doan | |
| 2006/0226527 A1 | 10/2006 | Hatano et al. | |
| 2007/0246837 A1* | 10/2007 | Dong | ................ H01L 21/76898 |
| | | | 257/778 |
| 2009/0072375 A1* | 3/2009 | Song | .................... H01L 21/563 |
| | | | 257/686 |
| 2010/0244221 A1 | 9/2010 | Ko et al. | |
| 2010/0327424 A1 | 12/2010 | Braunisch et al. | |

* cited by examiner

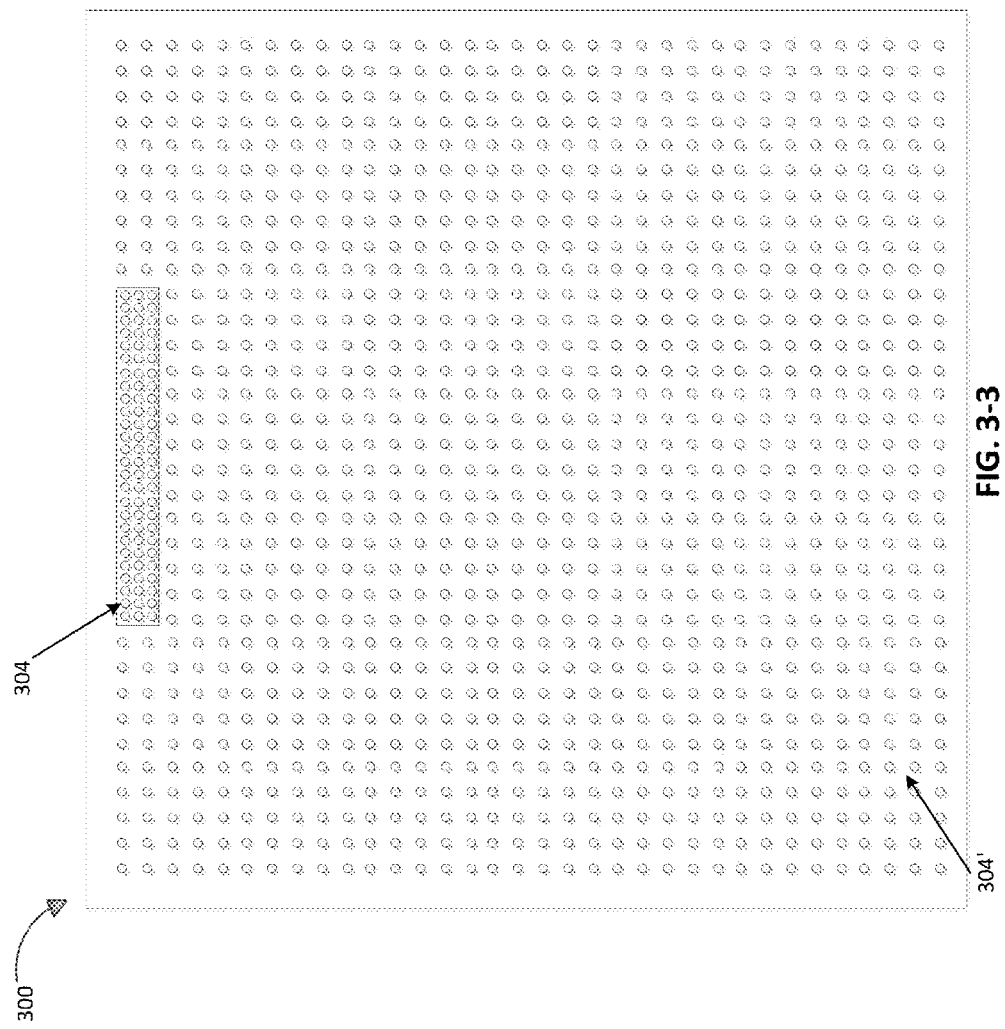

LOW INSERTION LOSS PACKAGE PIN STRUCTURE AND METHOD

FIELD

An embodiment described herein relates to package pin structures and BGA boards.

BACKGROUND

Many integrated circuits and semiconductor devices utilize an array of bumps, such as ball grid arrays (BGAs), for surface mounting packages such as printed circuit boards (PCBs). Package pin structure, such as C4 bumps or microbumps (as used in stacked silicon applications), may be used to conduct electrical signals between a channel on a chip or other package device, and the integrated circuit board (e.g., PCB), on which it is mounted.

As channel data rate requirements increase (e.g., from 14 Gbps to 28 Gbps and 56 Gbps), there is an increased need to be able to reduce the insertion loss of the channels in order to support the higher data rates. Channel insertion loss may be caused by a variety of factors, such as feature size, length of routings and transmission lines, and parasitics associated with the BGA bumps.

Thus, a package pin structure having a lower insertion loss so as to be able to support higher channel data rates may be desirable.

SUMMARY

A package assembly includes: a package having a first portion and a second portion, wherein the first portion comprises a first plurality of pads with a first pad pitch size; and an insert electrically coupled to the second portion of the package, the insert having a second plurality of pads with a second pad pitch size, the first pad pitch size being larger than the second pad pitch size.

Optionally, the insert comprises: a substrate having a top side and a bottom side; a first set of pads at the top side of the substrate; a second set of pads at the bottom side of the substrate; and a plurality of vias in the substrate, the vias connecting respective pads in the first set to respective pads in the second set.

Optionally, the package is configured for coupling to an integrated circuit board, and the insert has a thickness that is less than a spacing between the package and the integrated circuit board.

Optionally, the package assembly further includes a first solder ball attached to one of the first plurality of pads, and a second solder ball attached to one of the second plurality of pads, wherein the first solder ball is larger than the second solder ball.

Optionally, the first pad pitch size is approximately 1 mm.

Optionally, the second pad pitch size is approximately 0.5 mm or less.

Optionally, the insert is configured to couple directly with a flex interconnect.

Optionally, the insert is configured to couple indirectly with a flex interconnect.

Optionally, the insert is along an edge of the package.

Optionally, the insert is spaced away from an edge of the package by one or more rows of solder balls.

Optionally, the package assembly further includes a first set of solder balls and a second set of solder balls connected to opposite sides of the insert, wherein the insert and the first and second sets of the solder balls form a connection connecting the package and an integrated circuit board.

Optionally, the insert and the first and second sets of solder balls are configured to provide less parasitic capacitance compared to a single layer of solder balls that can otherwise be used to form the connection connecting the package and the integrated circuit board.

An apparatus for placement between a package and an integrated circuit board, includes: an insert having: a substrate having a top side and a bottom side; a first set of pads at the top side of the substrate; a second set of pads at the bottom side of the substrate; and a plurality of vias in the substrate, the vias connecting respective pads in the first set to respective pads in the second set; wherein the insert has a thickness that is less than a spacing between the package and the integrated circuit board.

Optionally, the apparatus further includes a first set of solder balls connected to the first set of pads.

Optionally, the apparatus further includes a second set of solder balls connected to the second set of pads, wherein the insert and the first and second sets of the solder balls form a connection connecting the package and the integrated circuit board.

Optionally, the insert and the first and second sets of solder balls are configured to provide less parasitic capacitance compared to a single layer of solder balls that can otherwise be used to form the connection connecting the package and the integrated circuit board.

Optionally, the apparatus further includes a plurality of solder balls located next to the insert, the solder balls having a height that is larger than the thickness of the insert.

Optionally, the insert is configured for placement between the package and the integrated circuit board, and is configured for electrical connection to both the package and the integrated circuit board.

Optionally, the apparatus further includes a flex interconnect connected to the insert.

A method of providing a hybrid package pin structure for a package includes: providing a package, the package having a first portion and a second portion; providing an insert, wherein the insert has a first side and a second side that is opposite from the first side, the first side of the insert having a first set of pads, and the second side of the insert having a second set of pads; attaching the insert to the second portion of the package using a first set of solder balls respectively disposed at the first set of pads, wherein a second set of solder balls are respectively disposed at the second set of pads at the insert; and disposing solder balls at the first portion of the package; wherein the second set of solder balls at the insert and the solder balls at the first portion of the package form a hybrid package pin structure for the package; and wherein one or more solder balls in the second set is smaller in size than one or more solder balls at the first portion of the package.

Other and further aspects and features will be evident from reading the following detailed description.

BRIEF DESCRIPTION OF THE DRAWINGS

The drawings illustrate the design and utility of various features described herein, in which similar elements are referred to by common reference numerals. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

FIG. 1-2 illustrates another BGA assembly.

FIG. 2 illustrates a pin map for a package.

FIGS. 3-1, 3-2, and 3-3 illustrate different packages with respective inserts in accordance with different embodiments.

FIGS. 4-1 and 4-2 illustrate a flex interconnect connecting two packages in accordance with some embodiments.

FIGS. 7-1, 7-2, and 7-3 illustrates graphical comparisons of a conventional BGA versus a smaller pitch BGA in accordance with some embodiments.

DETAILED DESCRIPTION

Figure 1:
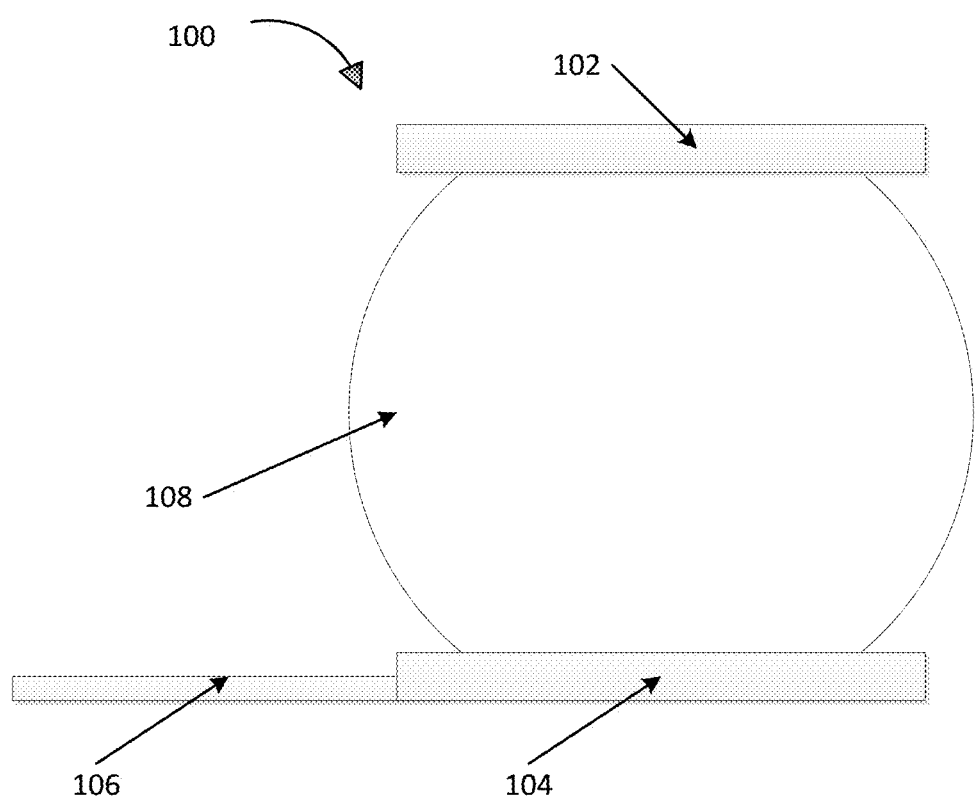
FIG. 1-1 illustrates a BGA assembly.

Various features are described hereinafter with reference to the figures. It should be noted that the figures are not drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments, even if not so illustrated, or if not explicitly described. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

In accordance with one or more embodiments described herein, a BGA assembly (package pin structure) includes an insert having vias therein. The insert may be configured for placement between a chip and an integrated circuit board. Instead of using a single large solder ball connecting the chip and the integrated circuit board, the BGA assembly comprises smaller solder balls on one side of the insert for connecting the insert to the chip, and smaller solder balls on the opposite side of the insert for connecting the insert to the integrated circuit board. Because the insert allows smaller solder balls be used to connect the chip and the integrated circuit board, higher pin densities may be achieved using the insert. In addition, because parasitic capacitance increases with the size of the solder ball, the smaller solder balls allow the BGA assembly to have a reduced parasitic capacitance in comparison with the configuration in which a single layer of solder balls is used to connect the chip and the integrated circuit board. In some cases, higher data transfer rates (e.g., 56 Gbps and above) may be achieved due to lower insertion loss and additional channels may be achieved due to higher pin density.

FIG. 1-1 illustrates a BGA assembly (package pin structure) 100 for an integrated circuit device. The BGA assembly 100 has a solder ball 108 that is configured to conduct signals between a top pad 102 and bottom pad 104. For example, the top pad 102 may be a pad on a chip, and the bottom pad 104 may be a pad on the integrated circuit board (e.g., PCB) that the chip is mounted on. Signals may then be transmitted to or from the bottom pad 104 through a trace, transmission line, or other type of routing 106. In some applications, the ball/pad pitch of the BGA assembly 100 may be configured to be 1 mm. Such configuration allows the BGA assembly 100 to support a serial-and-de-serial (SerDes) transmission of 28 Gbps.

The large diameter of solder ball 108 limits the pin density of the system, as well as resulting in high parasitic capacitance. The high parasitic capacitance of the solder ball 108 may result in higher return loss (RL) and insertion loss (IL), limiting the SerDes transmission of the system.

Although only one solder ball 108 is shown in the example, it should be noted that there may be a plurality of solder balls 108 in the BGA assembly 100, with each solder ball 108 attached to a respective pad 102 and a respective pad 104.

Figures 1, 2:
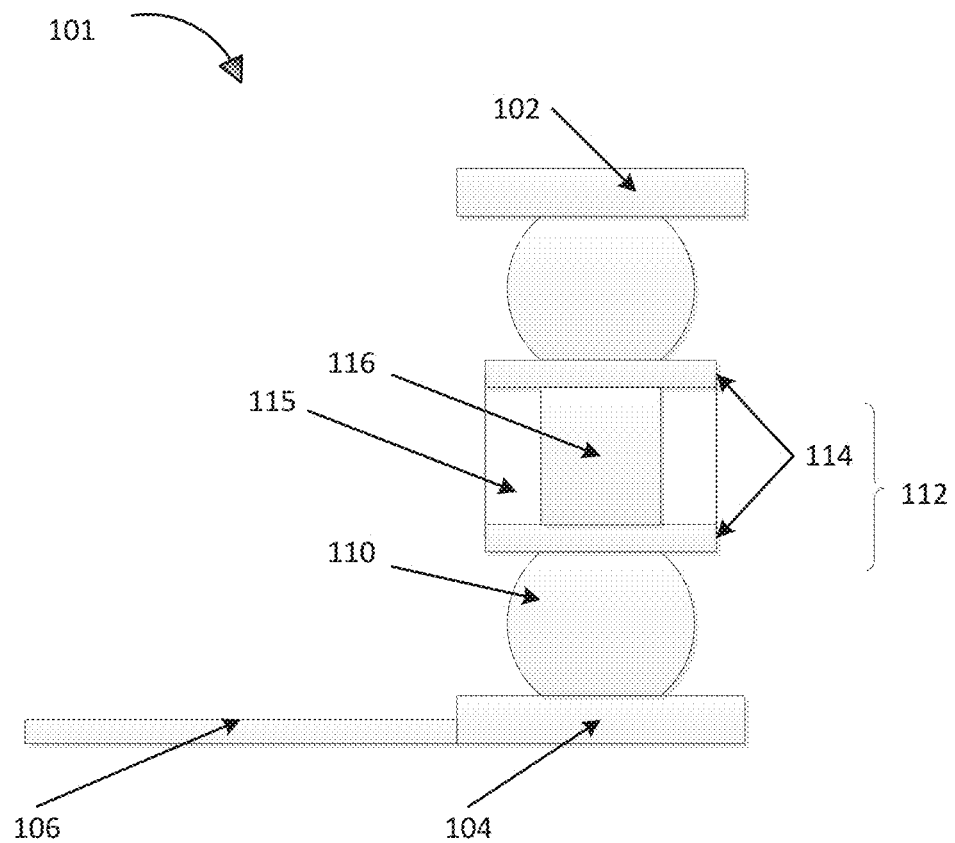
Figure 2:
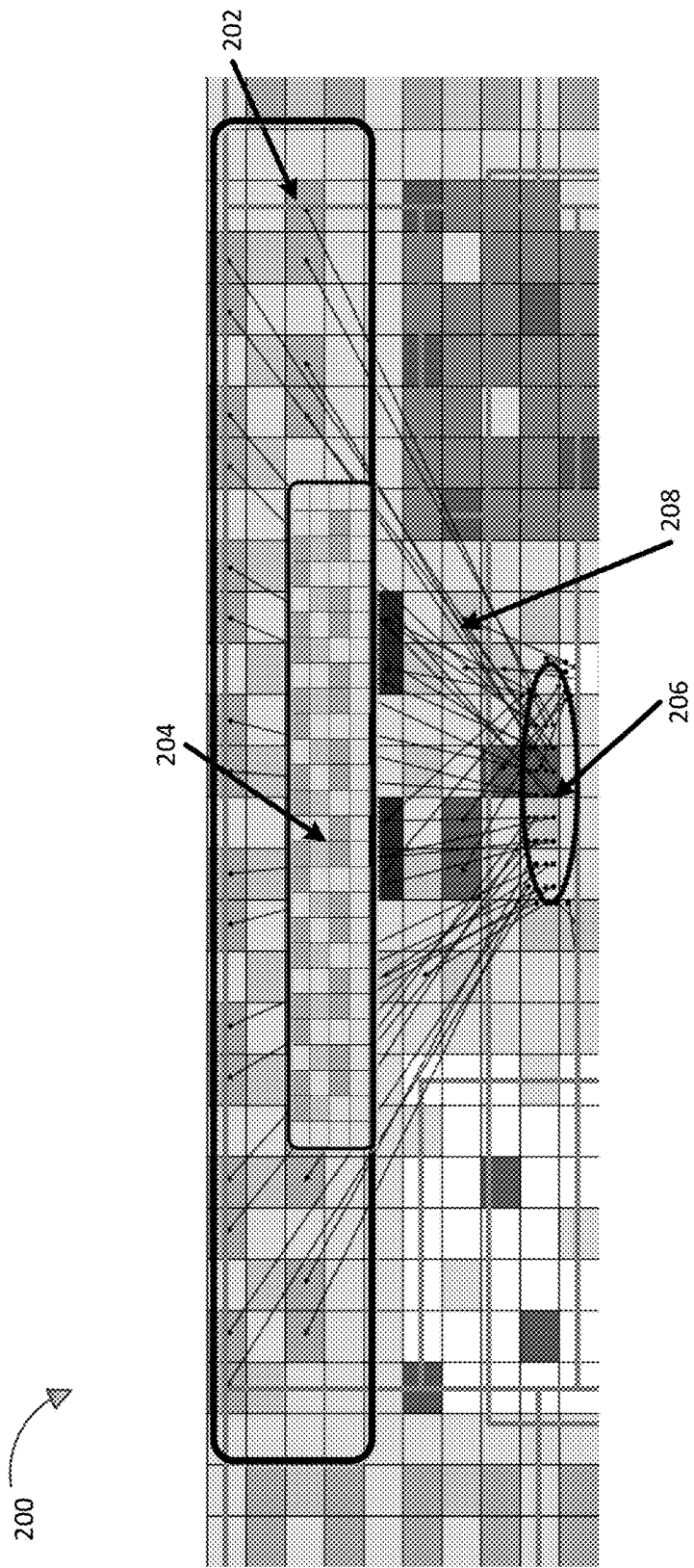

FIG. 1-2 illustrates a BGA assembly (package pin structure) 101 in accordance with some embodiments. Instead of a single large solder ball 108 connecting a top pad 102 and a bottom pad 104, the BGA assembly 101 comprises two smaller solder balls 110 connected to a top pad 102 and a bottom pad 104, respectively. The two solder balls 110 are connected by an insert 112. In some embodiments, the insert 112 may be a two-layer interposer having two interposer pads 114 (top and bottom interposer pads 114), connected by a via 116 disposed between the interposer pads 114.

The solder balls 110, interposer pads 114, and the via 116 of the BGA assembly 101 form a connection connecting the top pad 102 and the bottom pad, and are configured to conduct signals between the top pad 102 and the bottom pad 104. In some embodiments, the top pad 102 may be a pad on a chip (package), and the bottom pad 104 may be a pad on an integrated circuit board (e.g., PCB) that the chip is mounted on. Thus, the insert 112 of the BGA assembly 101 is configured for placement between the chip and the integrated circuit board. Signals may then be transmitted to or from the bottom pad 104 through a trace, transmission line, or other type of routing 106.

In some embodiments, the insert 112 may have more than two interposer layers. For example, in other embodiments, the insert 112 may have three interposer layers, with the top most interposer layer being the interposer pad 114, and a bottom most interposer layer being the interposer pad 114. In such configuration, there may be two vias 116, with a first via 116 disposed between the top most interposer layer and the middle interposer layer, and a second via 116 disposed between the middle interposer layer and the bottom most interposer layer. In other embodiments, the insert 112 may have only one interposer layer.

Although only one pair of solder balls 110 is shown in the example, it should be noted that there may be a plurality of pairs of solder balls 110 in the BGA assembly 101. The solder balls 110 in each pair are attached to respective pads 102, 104 of the insert 112. Also, the pads 114 for each pair of solder balls 110 may be electrically connected to each other through one or more vias 116 in the insert 112.

In some embodiments, the insert 112 may further include a dielectric substrate 115 in which the vias 116 are disposed. The substrate 115 has a first side (e.g., a top side) with a first plurality of the pads 114, and a second side (e.g., a bottom side) with a second plurality of the pads 114. The vias 116 in the substrate 115 connect respective pads 114 on the first side of the substrate to the respective pads 114 on the second side of the substrate. The substrate 115 allows the pads 114 and the vias 116 to be positioned and/or carried as one single unit.

In some embodiments, the insert 112 may be a full body size insert matching an area of a chip that is configured to be attached to an integrated circuit board (e.g., PCB), or a partial footprint insert corresponding to a portion of the chip.

In some embodiments, the ball/pin pitch of BGA assembly 101 may be configured to be approximately 0.5 mm. For example, the ball/pin pitch may be configured to be in the range of 0.2 mm to 0.8 mm, and more preferably in the range of 0.3 mm to 0.7 mm. In some embodiments, the cross sectional dimension (e.g., diameter) of the solder ball 110 may be between approximately 150 µm and 200 µm, and the height of insert 112 may also be configured to be between approximately 150 µm and 200 µm, such that the total height of BGA assembly 101 may be between 450 µm and 600 µm.

In other embodiments, the ball/pin pitch of the BGA assembly 101 may have other values different from the above examples. Also, in other embodiments, the cross sectional dimension of the solder ball 110 may have other values, and the height of the insert 112 may have other values different from the above examples. In addition, in other embodiments, the total height of the BGA assembly 101 may have other values that are different from the above example.

In some embodiments, a width of the pad 114 may be the same size as the cross sectional dimension of the via 116. In other embodiments, the width of the pad 114 may be smaller than the cross sectional dimension of the via 116. In further embodiments, the width of the pad 114 may be larger than the cross sectional dimension of the via 116. In some embodiments, the pad 114 and the via 116 may be aligned so that a longitudinal axis of the via 116 is aligned with a center of the solder ball 110. In other embodiments, the via 116 may be offset from the center of the solder ball 110.

In some embodiments, the total height of the BGA assembly 101 may be configured to be the same as that of a known BGA assembly (e.g., the BGA assembly 100), so that the two types of BGA assembly may be used together to form a hybrid package pin structure. For example, in some embodiments, a chip may be connected to an integrated circuit board (e.g., PCB) using both types of the BGA assemblies 100, 101. In such cases, the chip may be separated from the integrated circuit by a height H. A first portion of the chip may be electrically connected to the integrated circuit board using the BGA assembly 100 having a height H, and a second portion of the chip may be electrically connected to the integrated circuit using the BGA assembly 101 also having the height H. In such configuration, the insert 112 is configured for placement between the second portion the chip (package) and the integrated circuit board, and has a height that is less than a spacing between the chip and the integrated circuit board. The insert 112 has a plurality of solder balls 110 (implemented using the BGA assembly 101) connected thereto for attachment to the second portion of the chip. The first portion of the chip has solder balls (implemented using the BGA assembly 100) located next to the insert 112 that are attached to the first portion. This way, the BGA assembly 100 and the BGA assembly 101 together form a hybrid package pin structure for connecting the chip to the integrated circuit board. Because the solder balls at the BGA assembly 100 are a single layer of solder balls connecting the chip and the integrated circuit board, while the BGA assembly 101 has the insert 112 and two layers of solder balls disposed between the chip and the integrated circuit board, the solder balls at the BGA assembly 100 have a height that is larger than a thickness of the insert 112.

In other embodiments, there may be multiple chips connected to the integrated circuit board (e.g., PCB). For examples, there may be a first chip and a second chip connecting to the integrated circuit board. The first chip may be electrically connected to the integrated circuit board using the BGA assembly 100, and the second chip may be electrically connected to the integrated circuit board using the BGA assembly 101. In such cases, the BGA assemblies 100, 101 may have the same height, or different respective heights.

In some embodiments, the BGA assembly 101 may be used as a replacement for the BGA assembly 100 in some applications without impacting the system board escape and design rules. In such configuration, reliability of the package (chip) may be maintained despite the smaller solder balls used, due to the insert 112 providing additional support for the package.

In some embodiments, when the BGA assembly 101 and the BGA assembly 100 are configured to have the same height, it is appreciated that the footprint of the BGA assembly 101 may still be substantially smaller than that of the BGA assembly 100. This is because the solder balls 110 in the BGA assembly 101 may have a smaller size compared to the BGA assembly 100, thereby enabling higher pin densities. In some embodiments, the BGA assembly 101 may have an approximate 0.5 mm pitch, and the BGA assembly 100 may have an approximate 1 mm pitch, for examples. In addition, because parasitic capacitance increases with the size of the solder ball, the smaller solder balls 110 allow the BGA assembly 101 to have a reduced parasitic capacitance in comparison with the BGA assembly 100. As a result, higher data transfer rates (e.g., 56 Gbps and above) may be achieved due to lower insertion loss and additional channels may be achieved due to higher pin density.

FIG. 2 illustrates a pin map for a package 200, particularly showing how the BGA assembly 101 of FIG. 1-2 is advantageous over the BGA assembly 100 of FIG. 1-1. The package 200 may be a 35 mm square package. However, the package 200 may be other types of package. In the figure, each small box represents a BGA/pin's label or net, which may be an I/O or a power/ground. Also, as shown in the figure, the package 200 has a first pin-out area 202 that has four tx/rx channels. Each channel may be a full duplex 28 Gbps channel. The first pin-out area 202 of the package 200 may be used to connect to a low-loss PC board or a flex interconnect.

If 1 mm pitch BGA balls (e.g., as shown in FIG. 1-1) are used for the first pin-out area 202, the first pin-out area 202 of package 200 may occupy a large area of the package 200. However, if 0.5 mm pitch balls are used instead (e.g., by using BGA assembly 101 illustrated in FIG. 1-2), then each dimension of the pin-out area in which the BGA assembly 101 is implemented may be reduced by roughly half, achieving a total of approximately three-quarters area reduction. For example, as illustrated in FIG. 2, if the BGA assembly 101 is used instead of the BGA assembly 100, the BGA assembly 101 may occupy a second pin-out area 204 that is smaller than the first pin-out area 202. In the illustrated example, the second pin-out area 204 is implemented using a BGA assembly 101 with a 0.5 mm ball pitch, which is much smaller than the pin-out area 202 using 1 mm ball pitch.

The reduction in size of the second pin-out area 204 allows for a reduction in routing lengths of the package. The package 200 may have many different routings from package bumps (e.g., C4 bumps from a die mounted on the package substrate) 206 to the pin-out locations (e.g., pin-out area 202/204). The connections 208 (which may be referred to as the ratsnest) connect the package bumps 206 to the pin-out areas 202/204 on the package 200.

By reducing the ball pitch and thus reducing the size of the pin-out area (e.g., from 202 to 204), the distance between the package bumps 206 and the second pin-out area 204 is reduced, and thus the length of the routings in the ratsnest 208 connecting the package bumps 206 to the second pin-out area 204 may be much smaller than if the 1 mm ball pitch second pin-out area 202 was used. As routing length is one of the factors contributing to insertion loss (e.g., higher routing lengths mean higher insertion loss), reducing the length of the routings in the ratsnest 208 may help to reduce the insertion loss of the package 200.

Figures 1, 3:
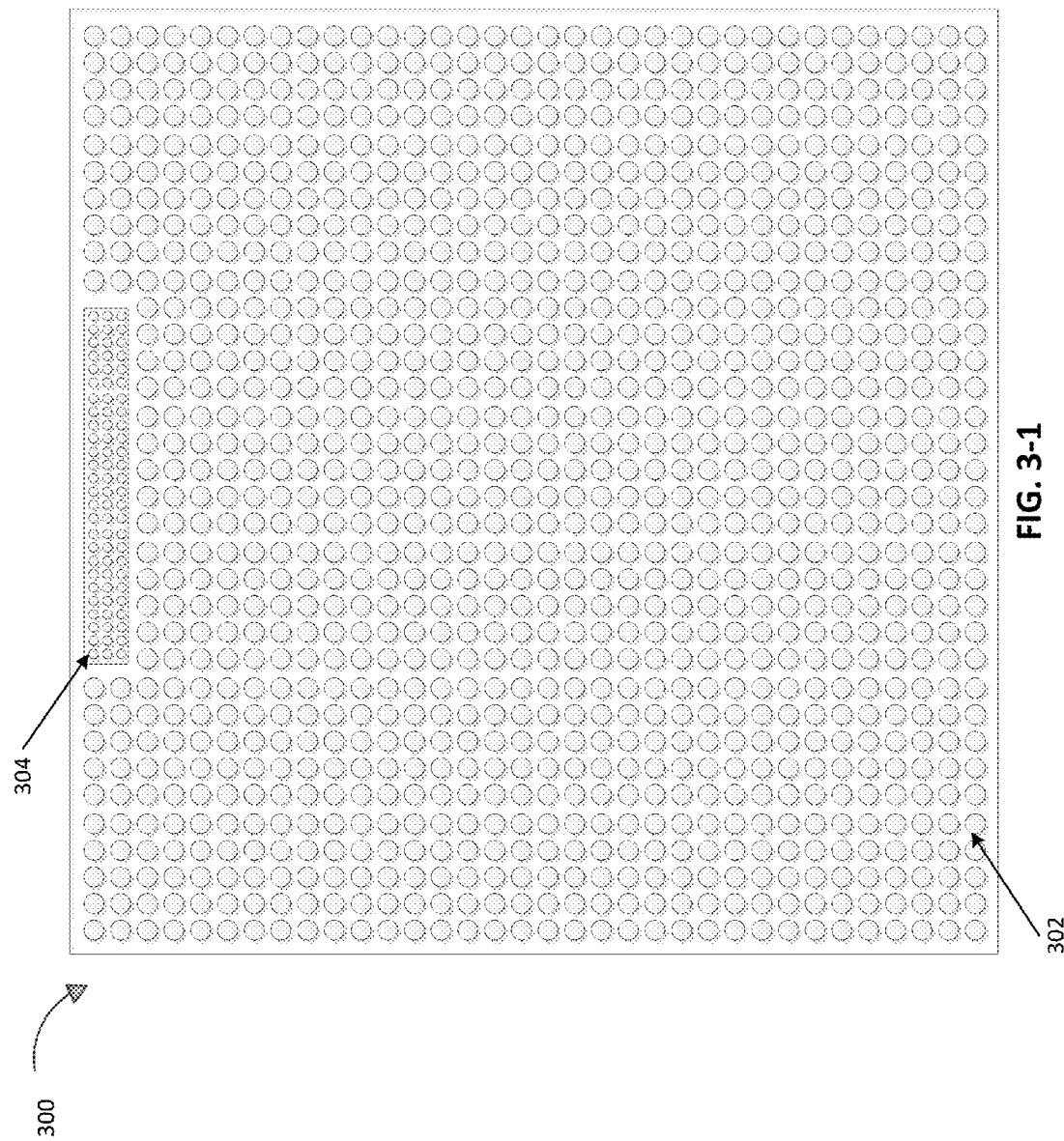
Figures 2, 3:
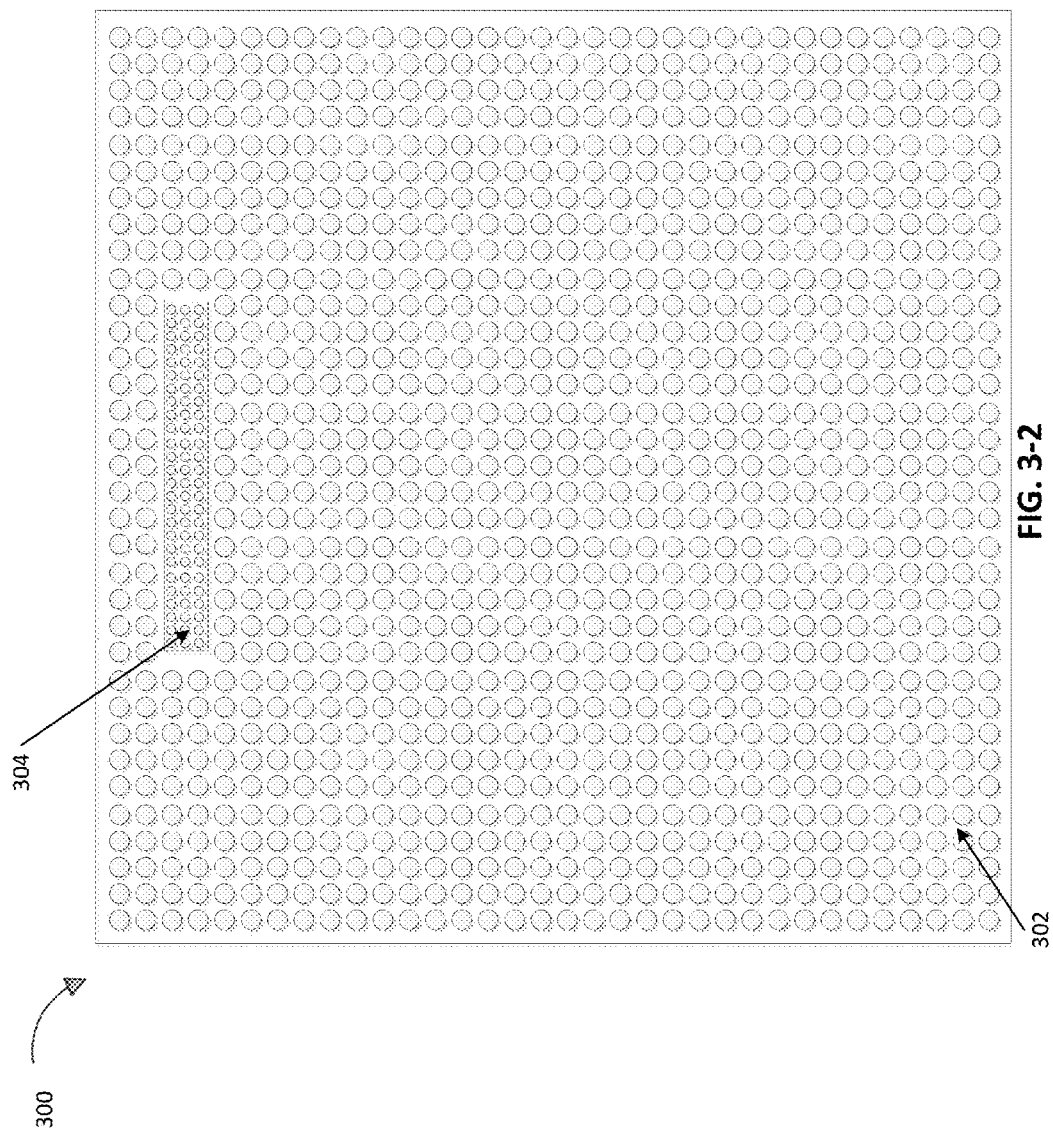

FIGS. 3-1, 3-2, and 3-3 illustrate different packages 300 with the BGA assembly 101 of FIG. 1-2 in accordance with different embodiments. Whereas a conventional BGA package may have solder balls with uniform size and a uniform ball pitch size through the entire package, FIG. 3-1 illustrates a package 300 utilizing an insert 304 to create a hybrid package pin structure. In some embodiments, the package 300 may be a 35 mm square package with 34 (or other numbers) BGA balls on each side. In other embodiments, the package 300 may be other types of package. The insert 304 may be the insert 112 of the BGA assembly 101 of FIG. 1-2 in some embodiments. In the illustrated embodiments, the insert 304 is mechanically and/or electrically coupled to a side (e.g., top side, bottom side, etc.) of the package 300 to form a package assembly. Also, in the illustrated embodiments, the insert 304 is positioned under an area along one edge of the package 300. In some embodiments, the insert 304 may be considered to be a part of the package 300, in which case, the package 300 may be considered to be a package assembly that has a package pin structure formed using the insert 304.

As shown in the figure, the insert 304 covers only a part of the total area of the package 300, so that the package 300 contains a first portion 302 having larger solder ball size and larger ball pitch, and a second portion (where the insert 304 is implemented) having smaller solder ball size and smaller ball pitch. In some embodiments, the first portion 302 of the package 300 has a first set of pads for connection to respective solder balls (e.g., solder balls 108 of FIG. 1-2). The package 300 also has a second portion with a second set of pads to which the insert 304 is connected. The insert 304 has solder balls attached to opposite sides of the insert 304, (such as that shown in the BGA assembly 101 of FIG. 1-2). The solder balls on one side of the insert 304 are attached to the second set of pads at the second portion of the package 300, and the solder balls on the opposite side of the insert 304 are for connection to an integrated circuit board. The solder balls at the first portion 302 of the package 300, and the insert 304 together with the solder balls attached to the opposite sides of the insert 304, collectively form a hybrid package pin structure for the package 300, so that the hybrid pin structure can be used to connect the package 300 to the integrated circuit board.

In some embodiments, the first set of pads at the first portion 302 has a first pad pitch size, and the second set of pads at the insert 304 has a second pad pitch size, wherein the first pad pitch size is larger than the second pad pitch size. For example, in some embodiments, the first pad pitch size is approximately 1 mm (e.g., 1 mm±0.2 mm), and the second pad pitch size is approximately 0.5 mm (e.g., 0.5 mm±0.1 mm). Also, in some embodiments, the first portion 302 of the package 300 has an array of solder balls with a larger ball pitch (e.g., 1 mm ball bitch) than that associated with the insert 304, and the insert 304 is connected to an array of solder balls with a smaller ball pitch (e.g., 0.5 mm ball pitch). In other embodiments, the first portion 302 of the package 300 may have solder balls with other ball pitches, and the insert 304 may be connected to an array of solder balls with other ball pitches.

FIG. 3-2 illustrates an alternate embodiment, wherein the insert 304 may be spaced away from the edge of the package 300. For example, as illustrated in FIG. 3-2, the insert 304 may be spaced away from the edge of the package 300 by two rows of conventional BGA balls. In other embodiments, the insert 304 may be spaced away from the edge of the package 300 by one row of conventional BGA balls, or more than two rows of conventional BGA balls. In the illustrated embodiments, the insert 304 is advantageous because it reduces routing distances (e.g., C4 to BGA distances, as discussed with reference to FIG. 2) in the package 300.

FIG. 3-3 illustrates another embodiment of the package 300, particularly showing the entire area of the package 300 having smaller BGA balls (compared to conventional BGA assembly). The package 300 of FIG. 3-3 is the same as the embodiments of FIG. 3-1, except that (in addition to the second portion of the package 300 having an insert 304 attached thereto) the first portion of the package 300 also has an insert 304' attached thereto in order to provide a pin structure having smaller BGA balls. Accordingly, in the embodiments of FIG. 3-3, there are two inserts 304, 304'. Each of the inserts 304, 304' may have the configuration shown in FIG. 1-2. In the illustrated embodiments, the insert 304' has pad pitch size that is larger than that of the insert 304. Thus, the solder balls attached to the insert 304' have corresponding ball pitch that is also larger than the ball pitch of the solder balls attached to the inert 304.

In the illustrated embodiments of FIG. 3-3, the BGA balls corresponding to the first portion 302 of the package 300 are also smaller BGA balls (compared to conventional BGA balls, such as that shown in FIG. 1-1), but may maintain the same ball pitch as that associated with conventional BGA balls, such as that shown in FIG. 1-1. Even though the same pitch size is maintained in the first portion 302 of the package 300, parasitic capacitance of the BGA balls in the first portion 302 is reduced due to the smaller size of the solder balls.

In the illustrated embodiments of FIG. 3-3, the insert 304 is next to an edge of the package 300. In other embodiments, the insert 304 may be spaced away from the edge of the package 300, like that discussed with reference to FIG. 3-2.

In some embodiments, the insert 304 has pads with a finer pitch (compared to the first portion 302 of the package 300) for increasing pin-out density for high speed signals and reducing routing lengths, while larger ball pitch at the first portion 302 of the package 300 may be used. In other embodiments, the entirety of the package 300 may use the finer pitch in order to decrease the size of the package 300. In such cases, the insert 304 will have pads that are configured to respectively align with all the pads on one side (e.g., top side, bottom side, etc.) of the package 300, and the insert 304 will have an area that corresponds with the entire area of the package 300.

In some embodiments, the package 300 may have multiple inserts 304 at different parts of the package 300. For example, in some embodiments, there may be multiple inserts 304 along a same side (e.g., edge) of the package 300. In other embodiments, there may be multiple inserts 304 along different respective sides (e.g., edges) of the package 300. In further embodiments, the package 300 has a top planar surface and a bottom planar surface that is opposite from the top planar surface, and there may be one or more inserts 304 attached to the top planar surface and one or more inserts 304 attached to the bottom planar surface of the package 300.

Figures 1, 4:
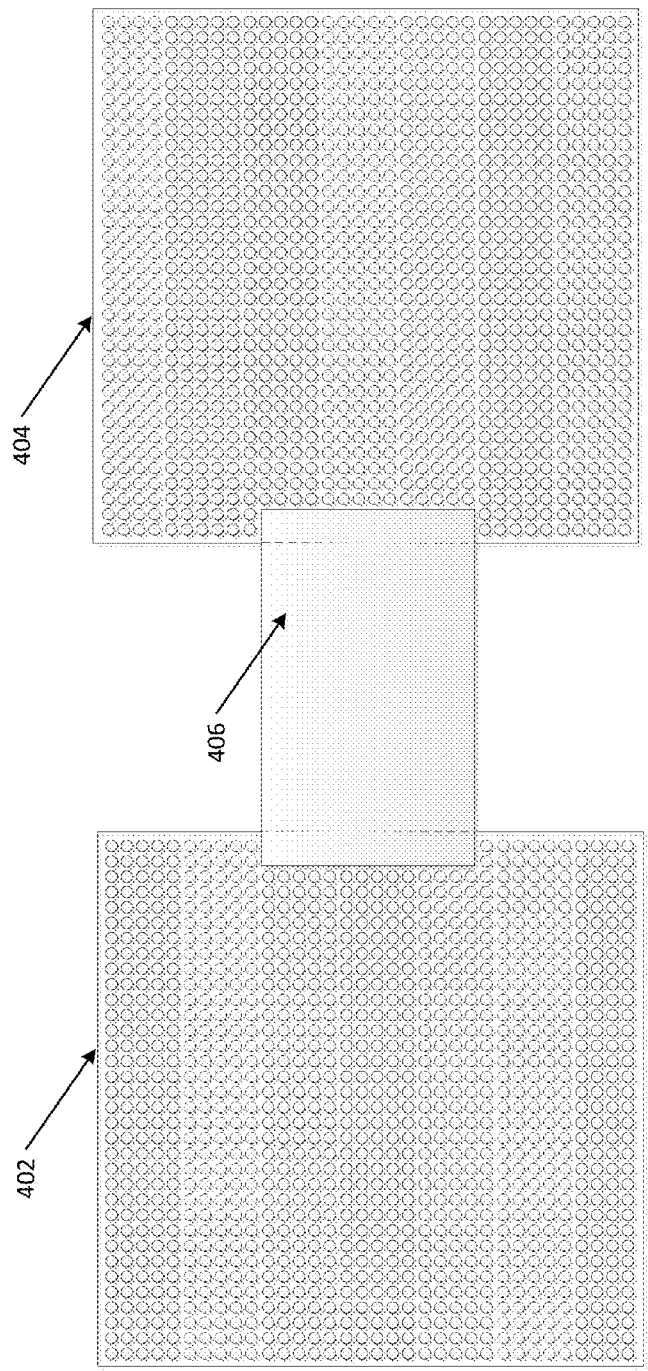
Figures 2, 4:
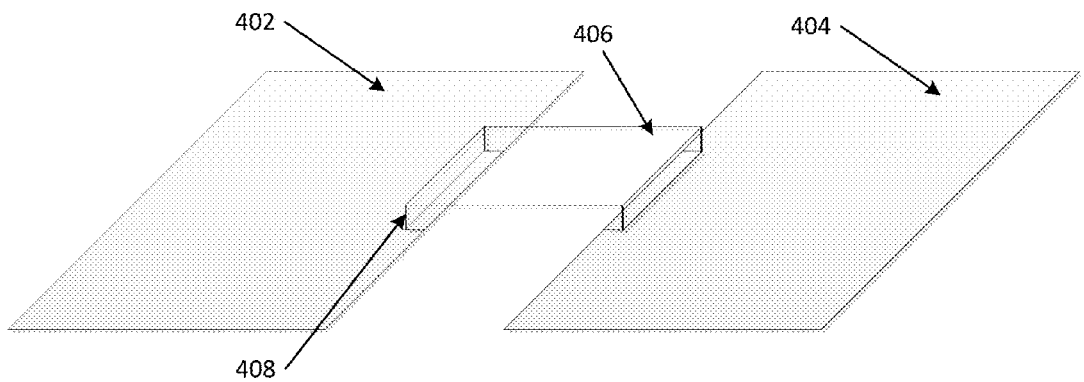

In some embodiments, multiple packages with respective inserts may be connected together. FIGS. 4-1 and 4-2 illustrate a package system having multiple packages (e.g., chips) connected together in accordance with some embodiments. As shown in the figure, a first chip 402 and second chip 404 located on the same system board (not shown) are connected by a flex interconnect 406. Each of the chips 402, 404 may be the package 300 described herein. For example, each of the first and second chips 402 and 404 may be the package 300 with edge mounted inserts 304 (like that shown in FIG. 3-1), although it will be appreciated that other configurations are also possible in other embodiments. The flex interconnect 406 is configured to create a channel by interfacing with the fine pitch pin portions (e.g., implemented using respective inserts 304) at the respective first and second chips 402 and 404, and may be a flex cable or ribbon.

The flex interconnect 406 may be mounted at one end on the near-side of the first chip 402, and at the opposite end on the near-side of the second chip 404, interfacing directly with the pins. For example, the flex interconnect 406 may be configured to be between the first and second chips 402, 404 and the PC board (not shown) on which first and second chips 402, 404 are mounted. Such configuration allows the first and second chips 402, 404 and the flex interconnect 406 to be on the same side of the PC board. The use of flex interconnect 406 may mean that the PC board does not need to be made of low-loss materials, as the low-loss channels are instead carried by the flex interconnect 406.

FIG. 4-2 illustrates an alternate embodiment wherein the chips 402 and 404 are connected via a flex interconnect 406 on the far side (on the other side of the PC board (not shown)). In such configuration, the chips 402, 404 are on one side of the PC board, while the flex interconnect 406 is on the opposite side of the PC board. In such an embodiment, the pin-out areas of first and second chips 402 and 404 may be indirectly connected to the flex interconnect 406 through a plurality of vias 408 through the PC board. For simplicity, only the four corner vias are illustrated in the figure. Having the flex interconnect on the far side may allow for a more transparent design, as the flex interconnect 406 will be more visible to a user or designer. However, the use of vias 408 may introduce additional parasitics. The vias 408 may be designed and tuned depending on the thickness of the PC board. The flex interconnect 406 may be attached to the vias 408 by a surface mount to the PC board.

Figure 5:
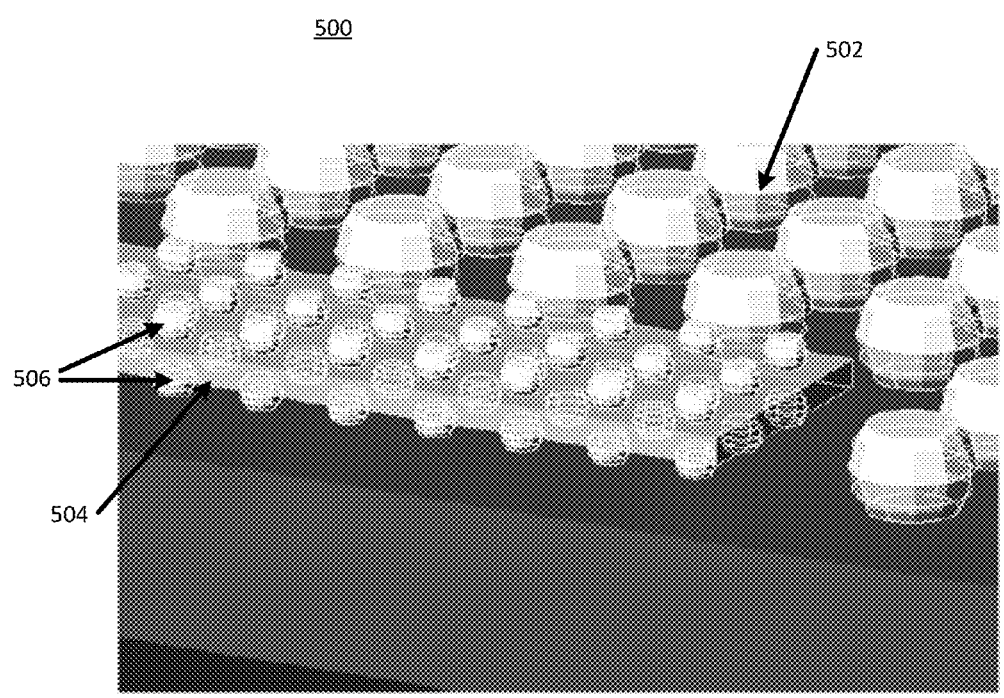
FIG. 5 illustrates a perspective view of a portion of a package having partial body insert in accordance with some embodiments.

FIG. 5 illustrates a perspective view of a portion of a package 500 with a first portion having larger balls 502, and an insert 504 mounted to a second portion (next to an edge) of the package 500 that has smaller solder balls 506 attached thereto. The insert 504 may be an example of the insert 112/304. The larger balls 502 may be implemented using the BGA assembly 100 of FIG. 1-1, and the smaller solder balls 506 may be implemented using the BGA assembly 101 of FIG. 1-2. The solder balls 506 are mounted on the top and bottom of the insert 504, and each pair of solder balls 506 that is above and below the insert 504 may be connected by a via (not shown) in the insert 504.

Figure 6:
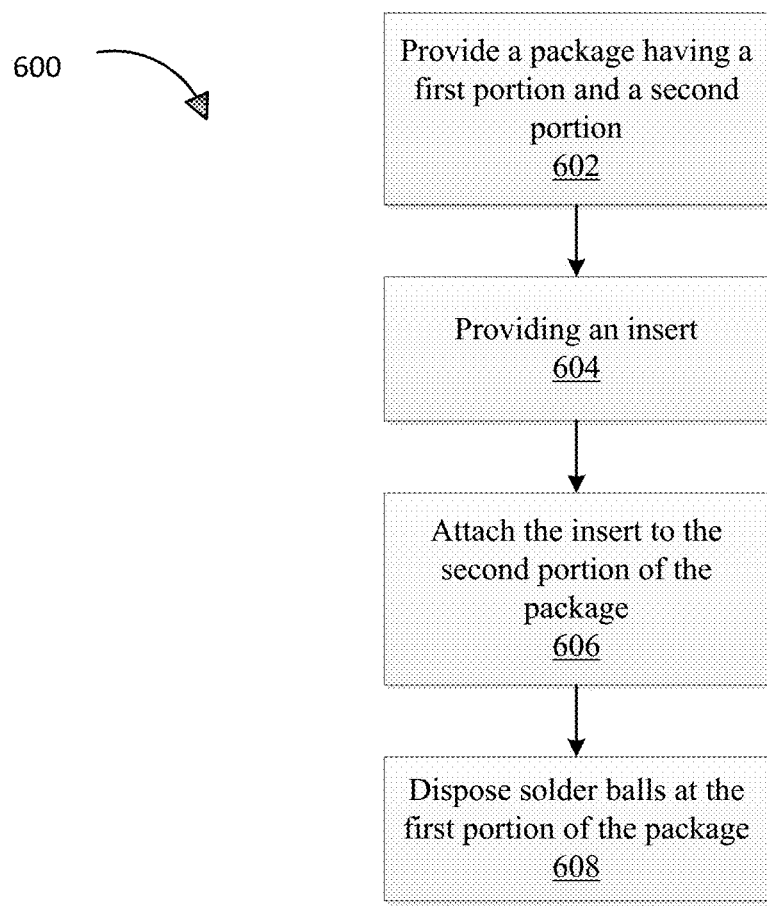
FIG. 6 illustrates a process of providing a hybrid package pin structure for a package in accordance with some embodiments.

FIG. 6 illustrates a method 600 for providing a hybrid package pin structure (e.g., as illustrated in FIGS. 3-1 to 3-3) for a package in accordance with some embodiments. First, a package is provided (item 602). The package has a first portion and a second portion. In some embodiments, the second portion of the package may correspond to a pin-out area with a higher channel data transfer rate, such as 56 Gbps. In other embodiments, the second portion of the package may have other characteristics.

Next, an insert is provided (item 604). The insert has a first side and a second side that is opposite from the first side, the first side of the insert having a first set of pads, and the second side of the insert having a second set of pads. In some embodiments, the insert may have the configuration shown in the embodiments of FIG. 1-2.

Returning to FIG. 6, next, the insert is attached to the second portion of the package (item 606). In the illustrated embodiments, the insert is attached to the second portion of the package using a first set of solder balls respectively disposed at the first set of pads. In some embodiments, the insert may be attached to the second portion of the package using surface mounts (e.g., solder balls reflow interconnect). In the illustrated embodiments, a second set of solder balls are respectively disposed at the second set of pads at the insert. In some embodiments, the second set of solder balls may be attached to the second set of pads at the insert after the insert is attached to the second portion of the package. In other embodiments, the second set of solder balls may be attached to the second set of pads at the insert before the insert is attached to the second portion of the package.

Next, solder balls are disposed at the first portion of the package (item 608). The second set of solder balls at the insert and the solder balls at the first portion of the package together form a hybrid package pin structure for the package. In the illustrated embodiments, one or more solder balls in the second set that is attached to the insert is smaller in size than one or more solder balls at the first portion of the package. In some embodiments, the second set of solder balls that is attached to the insert may have a ball pitch that is smaller than a ball pitch of the solder balls at the first portion of the package. In other embodiments, the second set of solder balls that is attached to the insert may have a ball pitch that is the same as a ball pitch of the solder balls at the first portion of the package.

In some embodiments, a flex interconnect may optionally be connected to one or more solder balls in the second set of solder balls at the insert. The flex interconnect may connected, either on the near-side of the package (like that shown in FIG. 4-1), or on the far-side of the package (like that shown in FIG. 4-2).

It is appreciated that although FIG. 6 illustrates items 602-608 in certain order, in other embodiments, items 602-608 may be performed in other orders.

Figures 1, 7:
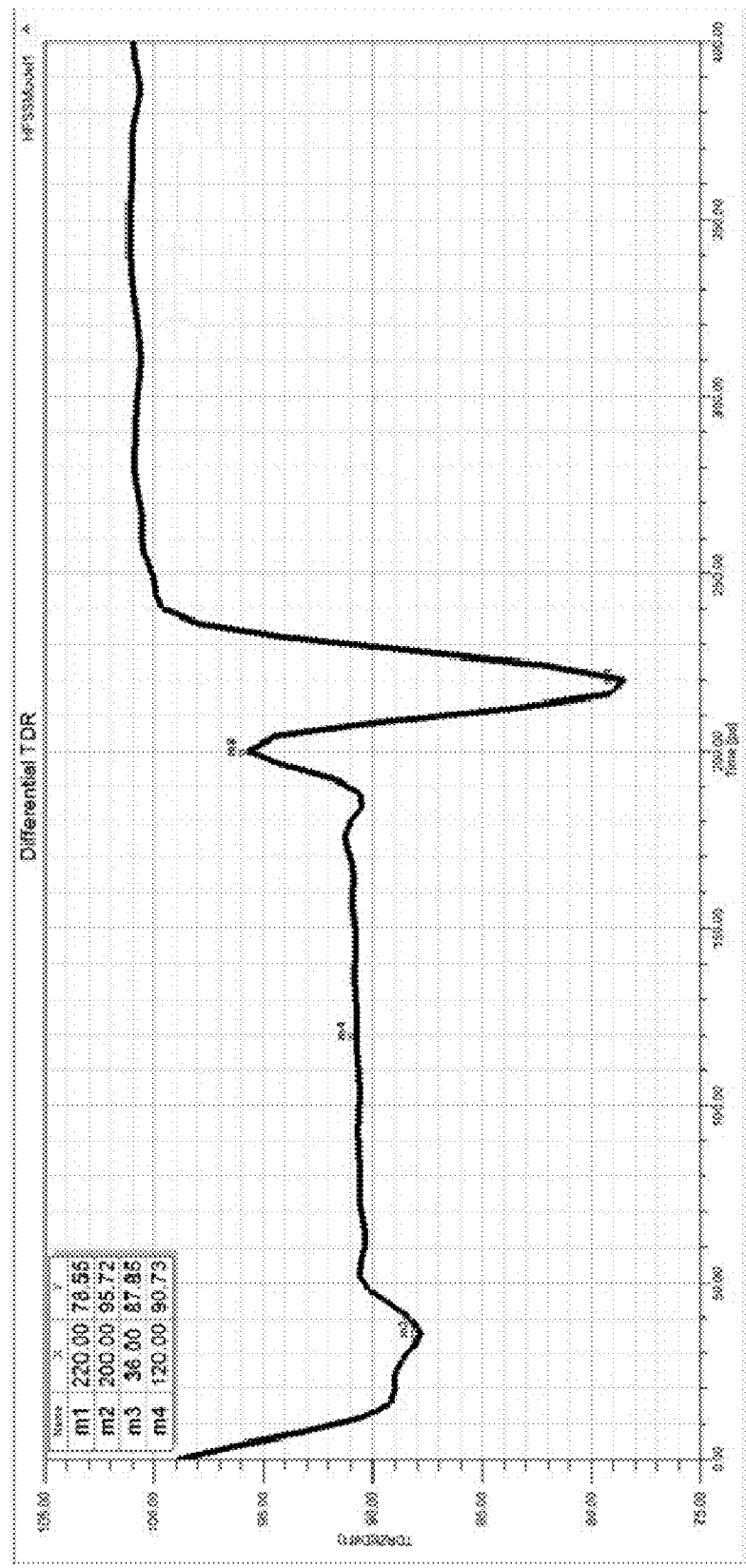
Figures 2, 7:
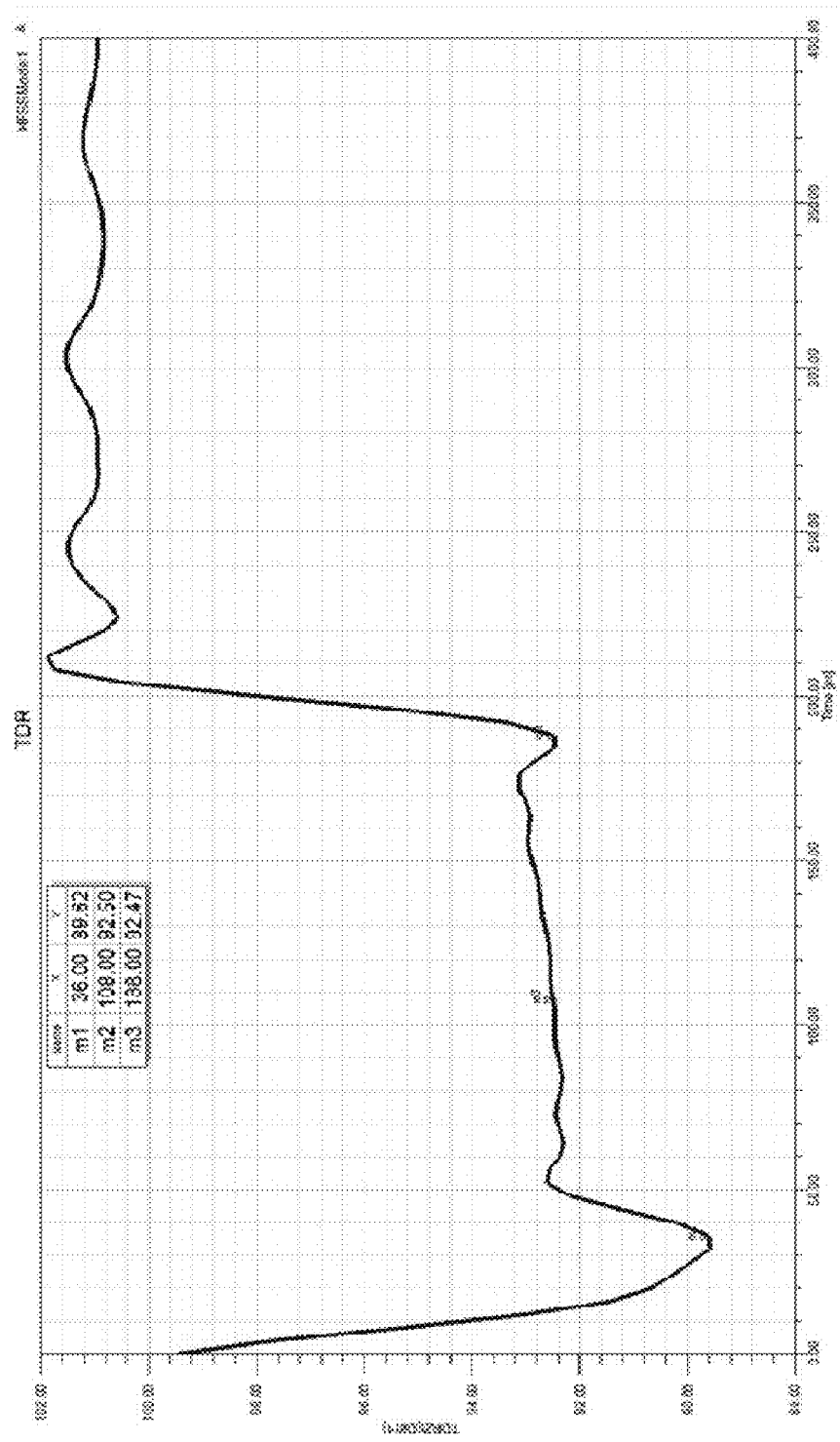
Figures 3, 7:
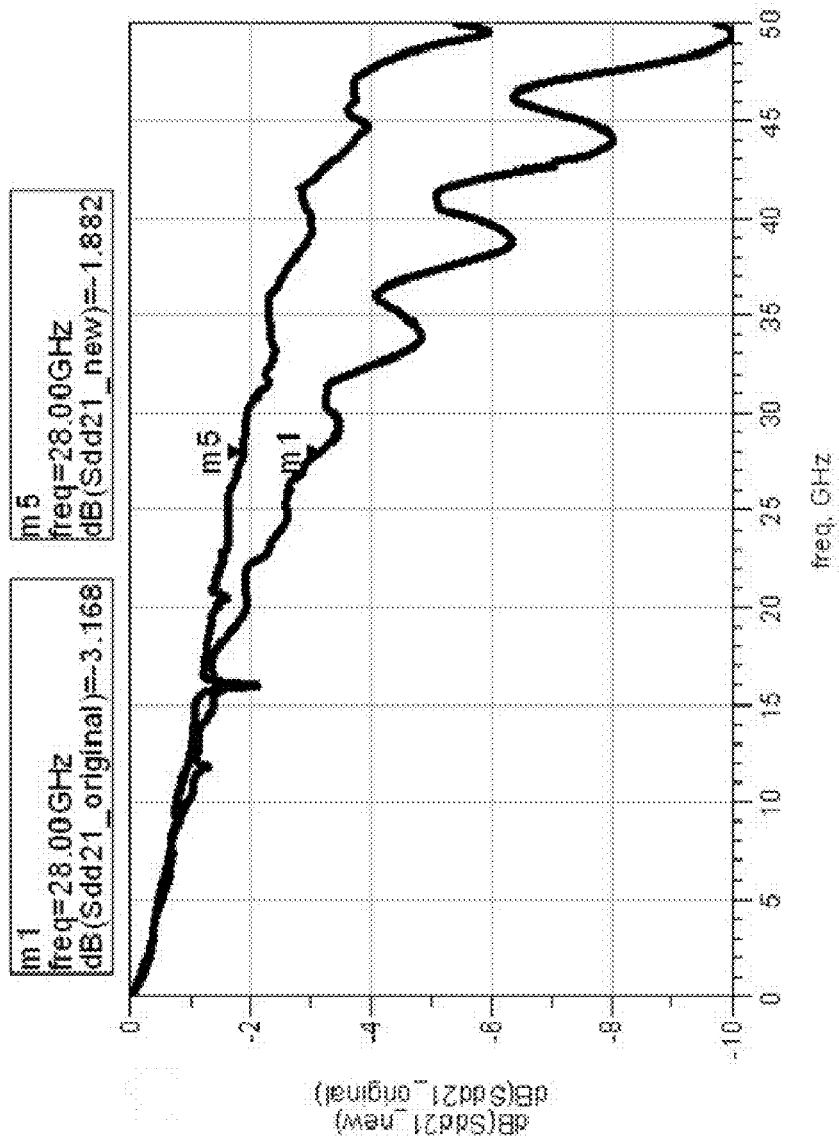

FIGS. 7-1 and 7-2 are graphs modeling the differential time-domain reflectometer (TDR) for 1 mm pitch BGA balls (which may be achieved using the BGA assembly 100 of FIGS. 1-1) and 0.5 mm pitch BGA balls (which may be achieved using the BGA assembly 101 of FIG. 1-2), respectively. These graphs are generated by first extracting transmission characteristics from 3-D FEM physical models of a channel design, and then analyzing the transient responses by circuit modeling software. The Y-axis represents the location-dependent impedance of the channel as seen by an injected signal traversing at a fast rise-time such as 10 ps or 20 ps. The values of various points m1-m4 in FIG. 7-1 are shown in the text box. The values of various points m1-m3 in FIG. 7-2 are also shown in the text box. The TDR reflects a transient impedance along a physical path of a channel.

In high-speed channels, it is desirable to having the driving signal of the channel see uniform impedance. In many applications, the differential impedance may be configured to be maintained at between 90 to 100 ohms. For many single-ended signals, an impedance of approximately 50 ohms is desirable.

The high-speed signal during transition sees a rise due to inductance and a dip due to capacitance. The lower impedance corresponding to the capacitive dip leads to insertion loss, degrading the energy transmitted through the channel, and return loss caused by reflection. As can be seen in FIGS. 7-1 and 7-2, the 1 mm ball pitch BGA may see a significant capacitive dip (i.e., at point m4 in FIG. 7-1). In comparison, the dip (i.e., at point m3 in FIG. 7-2) for the 0.5 mm pitch BGA is much smaller, due to the lower parasitic capacitance of the ball.

FIG. 7-3 illustrates a graph comparing the differential insertion losses of channels using a 1 mm BGA (e.g., m1 curve), which may be an example of that illustrated in FIG. 1-1) versus using a smaller 0.5 mm BGA (e.g., m5 curve), which may be an example of that illustrated in FIG. 1-2) in accordance with some embodiments. The two curves m1, m5 represent differential insertion loss, and are created by running a simulation tool on the 3-D FEM extracted s-parameter models of the channels. The x-axis represents the frequency of signal injected, and the y-axis represents decibel level of signal strength. The insertion loss may be compared at a frequency proportional to the Nyquist frequency of channel. For example, if the channel is configured to be 56 Gbps, the insertion loss may be compared at 28 GHz. As can been seen from the graph of FIG. 7-3, at 28 GHz there may more than a 1 dB difference between the two curves m1, m5. This difference is significant as the loss allowed for a package may be only around 2 dB.

In the above embodiments, the package pin structure 101 has been described as having an insert. In other embodiments, the package pin structure 101 may not include the insert. For example, in other embodiments, the small-pins and fine pitch of a package pin structure may be achieved using a hybrid Cu-post (copper pillar) processing on one or both of the pad 102 (which may be a package BGA pad, for example) and the pad 104 (which may be a PCB BGA pad, for example).

Although particular features have been shown and described, it will be understood that they are not intended to limit the claimed invention, and it will be clear to those skilled in the art that various changes and modifications may be made without departing from the scope of the claimed invention. The specification and drawings are, accordingly, to be regarded in an illustrative rather than restrictive sense. The claimed invention is intended to cover alternatives, modifications, and equivalents.

The invention claimed is:

1. A package assembly, comprising:
   a package having a first portion and a second portion, wherein the first portion comprises a first plurality of pads with a first pad pitch size;
   an insert electrically coupled to an edge area of the second portion of the package, the edge area being free from the first plurality of pads on at least one side, the insert having a second plurality of pads with a second pad pitch size, and the first pad pitch size being larger than the second pad pitch size;
   wherein the insert has a top side and a bottom side and comprises a first set of pads at the top side and a second set of pads at the bottom side, one of the first and second sets of the pads being the second plurality of pads;
   a first set of solder balls coupled to the first set of pads at the top side of the insert for connecting the insert to the package; and
   a second set of solder balls coupled to the second set of pads at the bottom side of the insert.

2. The package assembly of claim 1, wherein the insert comprises a plurality of vias connecting respective pads in the first set to respective pads in the second set.

3. The package assembly of claim 1, wherein the package is configured for coupling to an integrated circuit board, and the insert has a thickness that is less than a spacing between the package and the integrated circuit board.

4. The package assembly of claim 1, further comprising a first solder ball attached to one of the first plurality of pads, and a second solder ball attached to one of the second plurality of pads, wherein the first solder ball is larger than the second solder ball.

5. The package assembly of claim 1, wherein the first pad pitch size is approximately 1 mm.

6. The package assembly of claim 1, wherein the second pad pitch size is approximately 0.5 mm or less.

7. The package assembly of claim 1, wherein the insert is configured to couple directly with a flex interconnect.

8. The package assembly of claim 1, wherein the insert is along an edge of the package.

9. The package assembly of claim 1, wherein the insert is spaced away from an edge of the package by one or more rows of solder balls.

10. The package assembly of claim 1, wherein the insert and the first and second sets of the solder balls form a connection connecting the package and an integrated circuit board.

11. The package assembly of claim 1, further comprising a first solder ball attached to one of the first plurality of pads, wherein the insert, the first set of solder balls, and the second set of solder balls form a connection, and wherein the first solder ball and the connection have a same height.

12. The package assembly of claim 10, wherein the insert and the first and second sets of solder balls are configured to provide less parasitic capacitance compared to a single layer of solder balls for connecting the package and the integrated circuit board.

13. A method of providing a hybrid package pin structure for a package, comprising:
   providing a package, the package having a first portion and a second portion;
   providing an insert, wherein the insert has a first surface and a second surface that is opposite from the first surface, the first surface of the insert having a first set of pads, and the second surface of the insert having a second set of pads;
   attaching the insert to an edge area of the second portion of the package using a first set of solder balls respectively disposed at the first set of pads, wherein a second set of solder balls are respectively disposed at the second set of pads at the insert; and
   disposing solder balls at the first portion of the package, wherein the edge area of the second portion of the package is free, on at least one side, from the solder balls at the first portion of the package;
   wherein the second set of solder balls at the insert and the solder balls at the first portion of the package form the hybrid package pin structure for the package;

wherein one or more solder balls in the second set is smaller in size than one or more solder balls at the first portion of the package.

14. The method of claim 13, wherein:

the insert, the first set of solder balls, and the second set of solder balls form a connection; and the solder balls at the first portion of the package and the connection have a same height.

* * * * *